United States Patent
Bao et al.

(10) Patent No.: US 9,502,348 B2
(45) Date of Patent: Nov. 22, 2016

(54) SEMICONDUCTOR DEVICE AND FABRICATION METHOD THEREOF

(71) Applicant: Semiconductor Manufacturing International (Shanghai) Corporation, Shanghai (CN)

(72) Inventors: Xiaoyan Bao, Shanghai (CN); Hongtao Ge, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/941,702

(22) Filed: Nov. 16, 2015

(65) Prior Publication Data
US 2016/0163641 A1    Jun. 9, 2016

(30) Foreign Application Priority Data

Dec. 4, 2014    (CN) .......................... 2014 1 0734496

(51) Int. Cl.
| | |
|---|---|
| *H01L 23/522* | (2006.01) |
| *H01L 23/31* | (2006.01) |
| *H01L 27/06* | (2006.01) |
| *H01L 21/033* | (2006.01) |

(Continued)

(52) U.S. Cl.
CPC ....... *H01L 23/5227* (2013.01); *H01L 21/0332* (2013.01); *H01L 21/2885* (2013.01); *H01L 21/31144* (2013.01); *H01L 21/3212* (2013.01); *H01L 21/7684* (2013.01); *H01L 21/76802* (2013.01); *H01L 21/76877* (2013.01); *H01L 23/3171* (2013.01); *H01L 23/528* (2013.01); *H01L 23/5226* (2013.01); *H01L 23/53228* (2013.01); *H01L 27/0617* (2013.01); *H01L 27/0641* (2013.01); *H01L 27/0676* (2013.01); *H01L 28/10* (2013.01)

(58) Field of Classification Search
CPC .......... H01L 21/0332; H01L 21/2885; H01L 21/31144; H01L 21/3212; H01L 21/76802; H01L 21/7684; H01L 21/76877; H01L 23/3171; H01L 23/5226; H01L 23/5227; H01L 23/528; H01L 23/53228; H01L 27/0617; H01L 27/0641; H01L 27/0676; H01L 28/10
See application file for complete search history.

(56) References Cited

U.S. PATENT DOCUMENTS

| | | | | |
|---|---|---|---|---|
| 5,629,236 | A * | 5/1997 | Wada ................ | H01L 21/76838 257/E21.582 |
| 9,018,731 | B2 * | 4/2015 | Cheng .................... | H01L 28/10 257/531 |

(Continued)

*Primary Examiner* — Brett Feeney
*Assistant Examiner* — Sophia Nguyen
(74) *Attorney, Agent, or Firm* — Anova Law Group, PLLC

(57) ABSTRACT

A method for forming a semiconductor device includes, sequentially, providing a substrate having a first region and a second region; forming a first dielectric layer on the substrate; forming a second dielectric layer having a plurality of first openings exposing portions of a top surface of the first dielectric layer; forming a first conductive layer in the first openings; etching the second dielectric layer and the first dielectric layer in the second region until the substrate is exposed to form a plurality of second openings; forming passivation regions in portions of the substrate exposed by the second openings; exposing the surface of the first dielectric layer in the second region; forming a third dielectric layer on the surface of the first dielectric layer and in the second openings; and forming a second conductive layer, a portion of which is configured as an inductor, over the third dielectric layer.

19 Claims, 8 Drawing Sheets

(51) Int. Cl.
*H01L 21/768* (2006.01)
*H01L 21/311* (2006.01)
*H01L 49/02* (2006.01)
*H01L 21/288* (2006.01)
*H01L 21/321* (2006.01)
*H01L 23/528* (2006.01)
*H01L 23/532* (2006.01)

(56) References Cited

U.S. PATENT DOCUMENTS

| | | | |
|---|---|---|---|
| 2008/0157217 A1* | 7/2008 | Burke | H01L 21/76801 257/379 |
| 2009/0160018 A1* | 6/2009 | Nabeshima | H01L 23/5227 257/531 |
| 2011/0227167 A1* | 9/2011 | Chuang | H01L 23/5227 257/379 |
| 2013/0328164 A1* | 12/2013 | Cheng | H01L 28/10 257/531 |
| 2014/0183652 A1* | 7/2014 | Chern | H01L 27/0207 257/369 |
| 2014/0273434 A1* | 9/2014 | Peng | H01L 21/76841 438/643 |
| 2014/0295624 A1* | 10/2014 | Chen | H01L 23/3192 438/126 |
| 2015/0214287 A1* | 7/2015 | Huang | H01L 28/10 257/531 |
| 2016/0118338 A1* | 4/2016 | Zhang | H01L 23/5226 257/758 |
| 2016/0181179 A1* | 6/2016 | Lin | H01L 21/76816 257/774 |

* cited by examiner

SEMICONDUCTOR DEVICE AND FABRICATION METHOD THEREOF

CROSS-REFERENCES TO RELATED APPLICATIONS

This application claims the priority of Chinese patent application No. 201410734496.5, filed on Dec. 4, 2014, the entirety of which is incorporated herein by reference.

FIELD OF THE INVENTION

The present invention generally relates to the field of semiconductor manufacturing technology and, more particularly, relates to semiconductor devices and fabrication processes thereof.

BACKGROUND

In some integrated circuits (ICs), such as the radio frequency front-end modules (RF FEMs), etc., inductors are important electronic devices. The specific parameters of the inductors directly affect the performance of those ICs. In existing technologies, inductors are often planar inductors, such as planar spiral inductors, etc. The planar inductors are formed by winding a metal wire on the surface of a substrate or a dielectric layer. Comparing with conventional coil inductors, the planar inductors have the advantages including low cost, easy integration, low noise and low power consumption, etc. Most importantly, the planar inductors are compatible with existing IC fabrication processes.

FIGS. 1-2 illustrate an existing planar inductor. FIG. 1 is a cross-sectional view of the structure illustrated in FIG. 2 along the AA' direction; and FIG. 2 is a top view of the structure illustrated in FIG. 1.

The planar inductor includes a semiconductor substrate 100; and a dielectric layer 101 formed on the semiconductor substrate 100. Further, the planar inductor also includes a planar coil 102 formed on the dielectric layer 101.

As shown in FIG. 2, the planar coil 2 is formed by three turns of metal wires. The radius "R" of the most inner turn of the planar coil 102 is in a range of approximately 45 µm~50 µm. The width "W" of the metal wire of the planar coil 102 is in a range of approximately 8 µm~10 µm. The planar coil 102 has an octagonal shape. Further, one end of the planar coil 102 has an input contact point 103; and the other end of the planar coil 102 has an output contact point 104. The input contact point 103 and the output contact point 104 are used for current input and output, respectively.

For an inductor, a quality factor Q is used to evaluate its performance. The quality factor Q is equal to a ratio between the energy stored in the inductor and the energy lost during an oscillating period. Thus, the higher the quality factor Q is, the higher the efficiency of the inductor is; and the better the performance of the inductor is. The factors affecting the quality factor Q of an inductor include the inner resistance of the metal line of the coil, the parasitic capacitance between the coil and a metal layer over or below the coil, or the parasitic resistance between the coil and the semiconductor substrate. Specifically, the higher the resistance is, or the higher the parasitic capacitance is, the smaller the quality factor Q is, and the worse the performance of the inductor is.

However, the quality factor Q of the existing planar inductor is substantially low. Further, the fabrication process of the planar inductor has a relatively low integration level with the fabrication processes of other semiconductor devices. Thus, the fabrication process of the planar inductor is relatively complex. The disclosed device structures and methods are directed to solve one or more problems set forth above and other problems.

BRIEF SUMMARY OF THE DISCLOSURE

One aspect of the present disclosure includes a method for fabricating a semiconductor device. The method includes providing a substrate having a first region and a second region; and forming a first dielectric layer on a surface of the substrate. The method also includes forming a second dielectric layer having a plurality of first openings exposing portions of a top surface of the first dielectric layer; and forming a first conductive layer in the first openings. Further, the method includes etching the second dielectric layer in the second region and the first dielectric layer in the second region until the surface of the substrate is exposed to form a plurality of second openings; and forming passivation regions in portions of the substrate exposed by the second openings. Further, the method also includes exposing the surface of the first dielectric layer in the second region; forming a third dielectric layer on the surface of the first dielectric layer and in the second openings; and forming a second conductive layer, a portion of which is configured as an inductor, over the third dielectric layer.

Another aspect of the present disclosure includes a semiconductor device. The semiconductor device includes a substrate having a first region and a second region; and a plurality of passivation regions formed in portions of one surface of the substrate in the second region. Further, the semiconductor device also includes a first dielectric layer formed over the surface of the substrate; and a second dielectric layer formed on a top surface of the first dielectric layer in the first region. Further, the semiconductor device also includes a first conductive layer formed in the second dielectric layer and on the first dielectric layer in the first region; and a third dielectric layer formed on the surface of the first dielectric layer with portions penetrating through the first dielectric layer in the second region and connecting with plurality of passivation regions. Further, the semiconductor device also includes a second conductive layer, a portion of which is configured as an inductor in the second region and a portion of which is electrically connected with the first conductive layer in the first region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
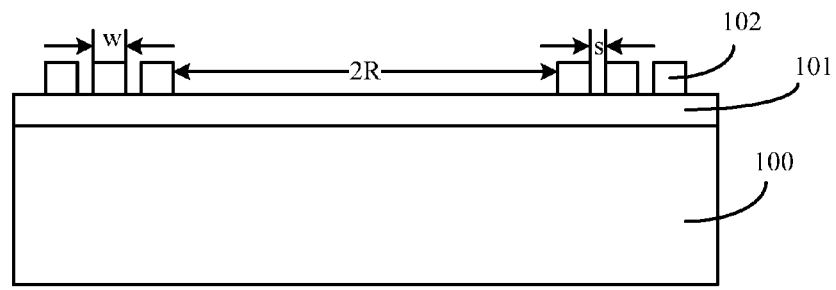
FIGS. 1~2 illustrate an existing planar inductor.
Figure 2:
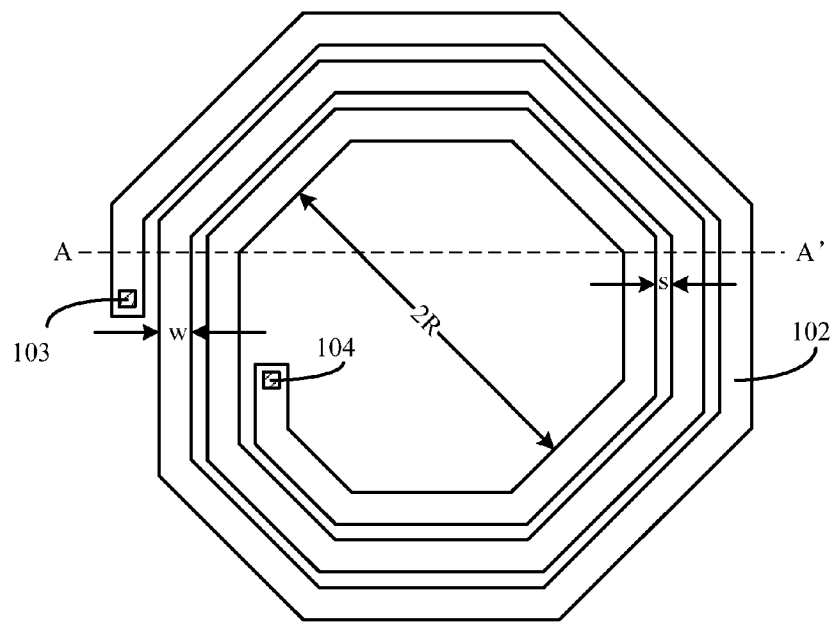

Referring to FIGS. 1~2, when the inductor is in operation, an electrical current flows in the planar coil 102, the spiral current may be able to generate an electromagnetic field perpendicular to the surface of the semiconductor substrate 100. According to the Lenz's law, the electromagnetic field penetrating through the semiconductor substrate 200 may induce a current, and the direction of the induced current may be opposite to the current in the planar coil 102. The induced current may also be able to generate a magnetic field perpendicular to the planar coil 102. Because the direction of the inducted current may be opposite to the direction of the current in the planar coil 102, the strength of the magnetic field of the inductor may be reduced. Thus, the inductance of the inductor may be reduced. Such an effect may be referred a substrate-power-consumption effect. Especially when the inductor is operated in a high frequency range, the reduction of the inductance caused by the substrate-power-consumption effect may be dramatic. Further, because the induced current may be generated in the semiconductor substrate 100, electrical charges may be stored in the semiconductor substrate 100. Thus, a parasitic capacitance may be generated between the semiconductor substrate 100 and the planar coil 102. The parasitic capacitance may also reduce the quality factor Q of the inductor.

To reduce the substrate-power-consumption effect, one approach is to perform a substrate passivation process. Referring to FIGS. 1~2, before forming the planar coil 102, a portion of the dielectric layer 101 may be etched to expose a portion of the surface of the semiconductor substrate 100. Then, an ion implantation process may be performed on the exposed portion of the surface of the semiconductor substrate 100. The high energy ions of the ion implantation process may bombard the exposed portion of the surface of the semiconductor substrate 100 to cause the exposed portion of the surface of the semiconductor substrate 100 to be at a high impedance state; and passivation regions may be formed. The passivation regions may break the induced current in the semiconductor substrate 100. Thus, the adverse effect to the quality factor Q of the inductor caused by the induced current in the semiconductor substrate 100 may be prohibited. After forming the passivation regions, the removed portion of the dielectric layer may be formed back to form the complete dielectric layer 101; and then the planar coil 102 may be formed on the surface of the dielectric layer 101.

However, because it may need to etch the dielectric layer to expose the portion of the semiconductor substrate 100, an extra mask may be needed; and an extra photolithography process may also be needed to form a patterned photoresist layer for etching the dielectric layer 101. Thus, the fabrication process may be complex, and the production cost may be relatively high.

Figure 3:
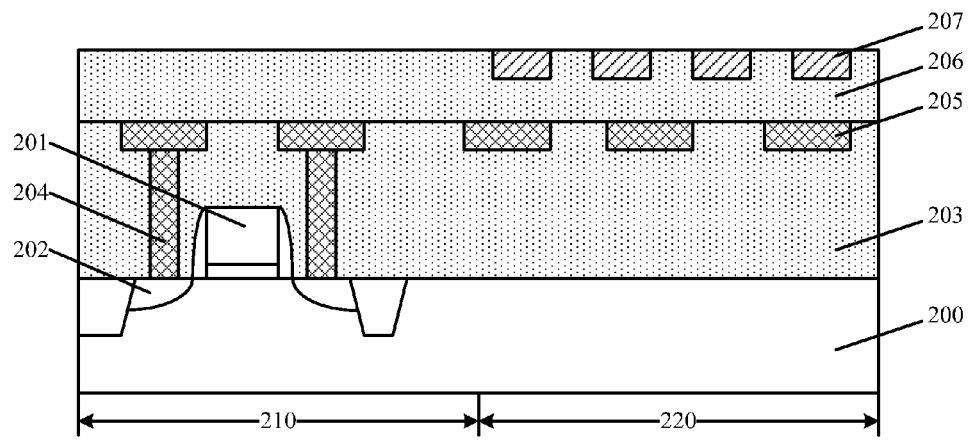
FIG. 3 illustrates an existing semiconductor device.

On the other hand, for ICs, besides the planar inductor, other semiconductor devices may also be formed on the semiconductor substrate of the planar inductor. FIG. 3 illustrates a corresponding semiconductor structure.

As shown in FIG. 3, the semiconductor structure may include a substrate 200. The substrate 200 may include a MOS region 210 and an inductor region 220. A gate structure 201 may be formed on the surface of the substrate 200 in the MOS region 210; and source/drain regions 202 may be formed in the substrate 200 at both sides of the gate structure 201. Further, a first dielectric layer 203 may be formed on the surface of the substrate 200 and the gate structure 201; and conductive vias 204 and conductive layers 205 may be formed in the first dielectric layer 203. The conductive vias 204 may be formed on the source/drain regions 202, and the conductive layers 205 may be electrically connected with the conductive vias 204. Further, the semiconductor structure may include a second dielectric layer 206 formed on the first dielectric layer 203; and an induction coil 207 formed on the surface of the second dielectric layer 206 in the inductor region 220.

A process for forming the conductive layers 205 may include forming a plurality of openings in the first dielectric layer 203; forming a conductive film on the surface of the first dielectric layer 203 and in the plurality of openings; and performing a chemical mechanical polishing (CMP) process onto the conductive film until the surface of the first dielectric layer 203 is exposed. Thus, the conductive layers 205 may be formed.

Some of the conductive layers 205 may be also in the first dielectric layer 203 in the inductor region 220. Further, the conductive layers 205 in the inductor region 220 may be on a same layer as the conductive layers 205 in the MOS region 210. Because the inductor region 220 may be used for forming the induction coil 207, if some of the conductive layers 205 are not formed in the first dielectric layer 203 in the inductor region 210, the area of the portion of the first dielectric layer 203 may be relatively large. During the chemical mechanical polishing (CMP) process, it may be easy to form defects on the surface of the relatively large portion of the first dielectric layer 203 in the inductor region 220. Metal material of the conductive film may be left in the defects after the CMP process. The left metal material in the defects may cause current leaking issues or short-circuit issues.

The conductive layers 205 formed in the inductor region 220 may be used as dummy layers to increase the density (number) of the conductive layer 205 in the inductor region 220. The dummy conductive layers 205 may aid the surface of first dielectric layer 203 to be significantly smooth; and to avoid the metal residue on the surface of the first dielectric layer 203. However, the conductive layers 205 in the inductor region 220 may be in between the inductor coil 207 and the substrate 200. It may be easy to generate extra parasitic capacitance between the induction coil 207 and the substrate 200. The extra capacitance may reduce the quality factor Q of the planar inductor.

Figure 13:
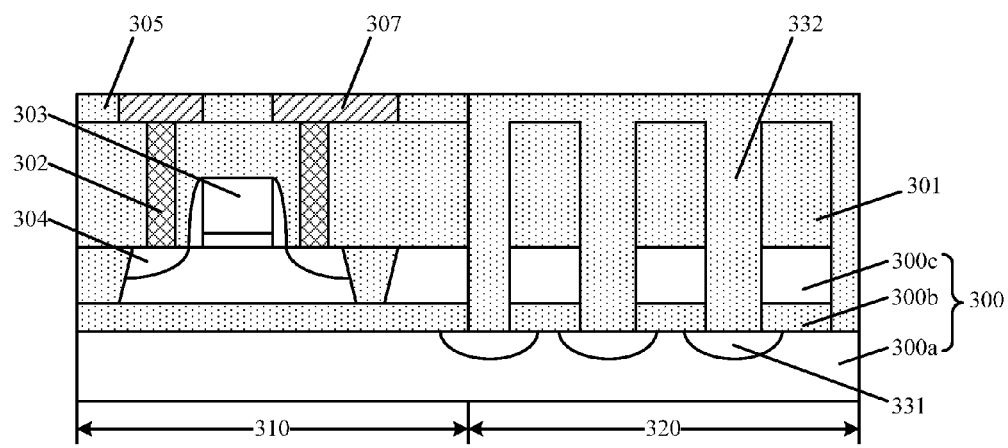
Figure 14:
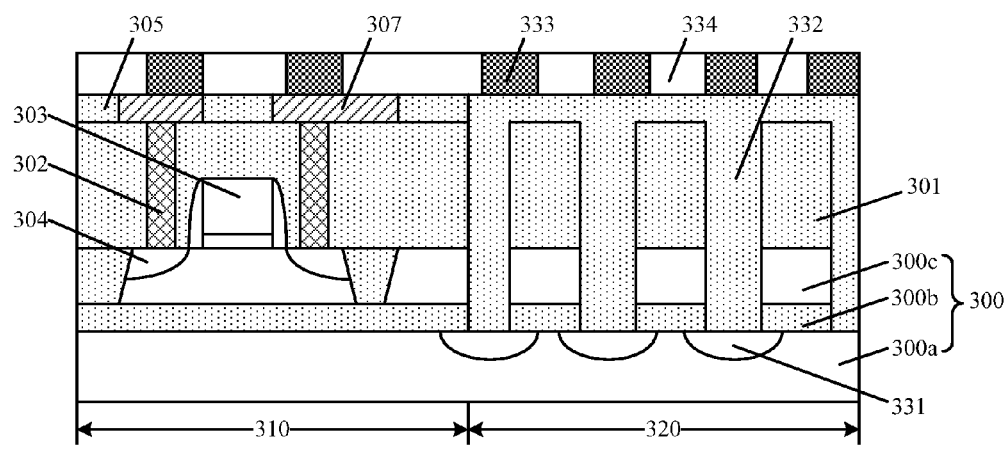
Figure 15:
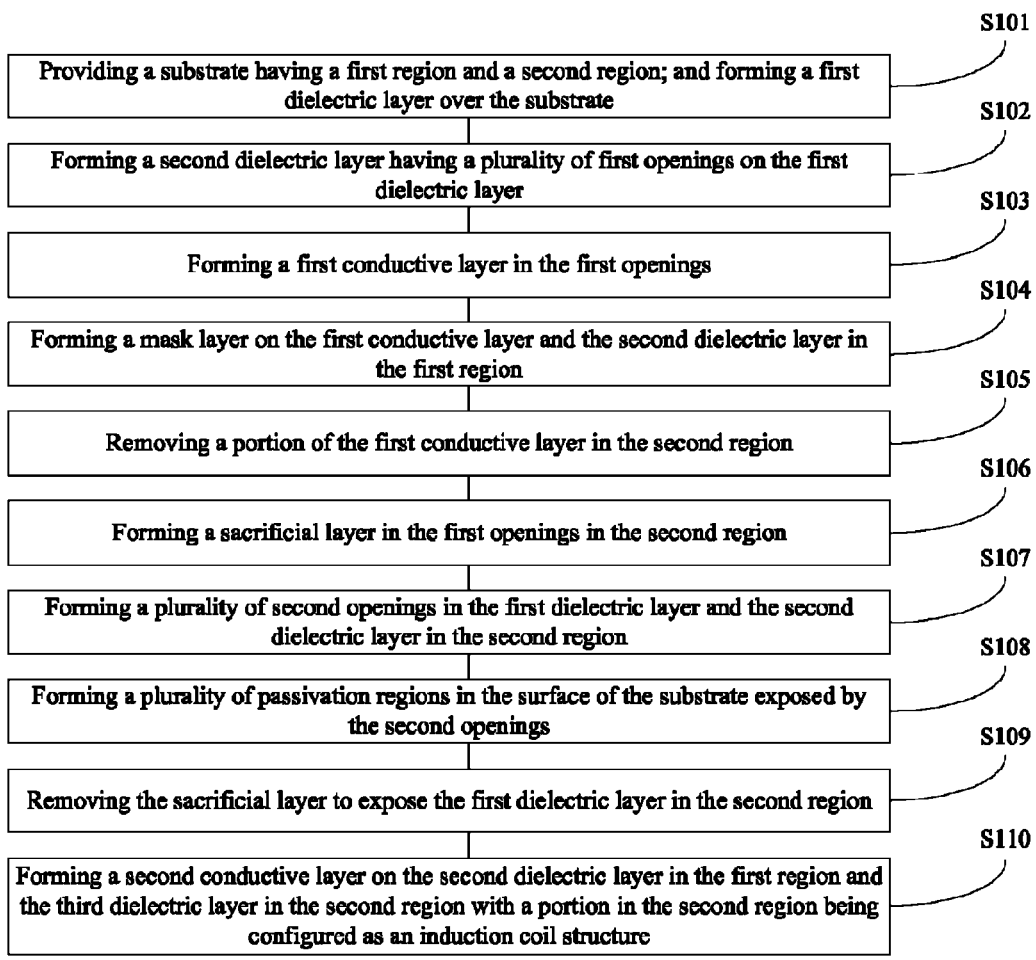
FIG. 15 illustrates an exemplary fabrication process of a semiconductor device consistent with the disclosed embodiments.

FIG. 15 illustrates an exemplary fabrication process of a semiconductor device consistent with the disclosed embodiments; and FIGS. 4~14 illustrate semiconductor structures corresponding certain stages of the exemplary fabrication process.

Figure 4:
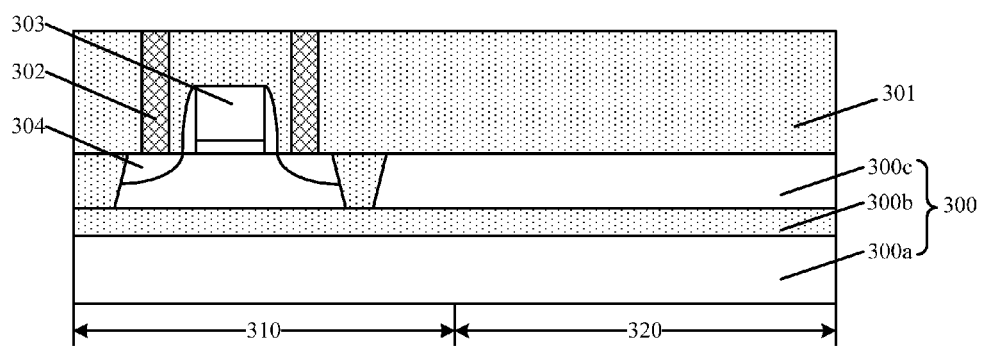
FIGS. 4~14 illustrate semiconductor structures corresponding to certain stages of an exemplary fabrication process of a semiconductor device consistent with the disclosed embodiments.

As show in FIG. 15, at the beginning of the fabrication process, a substrate with certain structures is provided (S101). FIG. 4 illustrates a corresponding semiconductor structure.

As shown in FIG. 4, a substrate 300 is provided. The substrate 300 may include a first region 310 and a second region 320. A first dielectric layer 301 may be formed on a surface of the substrate 300. Further, conductive vias 302 may be formed in the first dielectric layer 301 in the first region 310. Certain other devices may be included; and some devices may be omitted.

The semiconductor substrate 300 may be made of any appropriate semiconductor materials, such as single crystal silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor or a combination thereof. The substrate 300 provides a base for subsequent devices and processes.

In one embodiment, as shown in FIG. 4, the substrate 300 is a semiconductor on insulator substrate. The semiconductor on insulator substrate may include a base substrate 300a, an insulation layer 300b on the base substrate 300a, and a semiconductor layer 300c on the insulation layer 300b. The insulation layer 300b may be made of silicon oxide; and the semiconductor layer 300c may be made of single crystal silicon, or single crystal germanium.

In one embodiment, the first region 310 may be used for forming a MOS device, such as a PMOS transistor, an NMOS transistor, or a CMOS transistor, etc. The second region 320 may be used for forming an inductor. In certain other embodiments, the first region 310 may also be used for forming other devices, such as resistors, capacitors, fuses, or storage devices, etc.

In one embodiment, as shown in FIG. 4, a gate structure 303 may be formed on the surface of the substrate 300 in the first region 310. The first dielectric layer 301 may be formed on the surface of the gate structure 303. Further, source/drain regions 304 may be formed in the substrate 300 at both sides of the gate structure 303. Conductive vias 302 may be formed on the source/drain regions 304. The conductive vias 302 may electrically connect with the source/drain regions 304; and may be able to apply a bias voltage to the source/drain regions 304.

In one embodiment, the conductive vias 302 penetrate through the first dielectric layer 301. The first dielectric layer 301 may expose the top surfaces of the conductive vias 302.

The gate structure 303 may include a gate dielectric layer (not labeled) formed on the surface of the substrate 300, a gate electrode layer (not labeled) formed on the surface of the gate dielectric layer; and sidewall spacers formed around the gate dielectric layer and the gate electrode layer. In one embodiment, the gate dielectric layer may be made of high dielectric constant material. The gate electrode layer may be made of metal. In certain other embodiments, the gate dielectric layer may be made of silicon oxide; and the gate electrode layer may be made of poly silicon. The sidewall spacers may be made of one or more of silicon oxide, silicon nitride, and silicon oxynitride, etc.

Further, shallow trench isolation (STI) structures (not labeled) may be formed in the substrate 300 around the gate structure 303 and the source/drain regions 304. The STI structures may be used to isolate the active regions for forming the transistor. In one embodiment, the substrate 300 is a semiconductor on insulator substrate, the STI structures may connect with the insulation layer 300b. Thus, the portion of the semiconductor layer 300c having the transistor may be entirely isolated from the base substrate 300a. The STI structures may be made of silicon oxide, silicon nitride, or silicon oxynitride, etc.

The first dielectric layer 301 may be formed on the surface of the substrate 300 and the surface of the gate structure 303. The first dielectric layer 301 may be made of silicon oxide, silicon nitride, silicon oxynitride, low dielectric constant (low-K) material, or ultra-low-K material, etc.

A process for forming the first dielectric layer 301 may include forming a first dielectric film on the surfaces of the substrate 300 and the gate structure 303; and performing a chemical mechanical polishing (CMP) process on the first dielectric film to planarize the first dielectric film. Thus, the first dielectric layer 301 may be formed.

The conductive vias 302 may be made of any appropriate material, such as one or more of Cu, Al, Ti, TiN, Ta, and TaN, etc. A process for forming the conductive vias 302 may include forming a mask layer exposing portions of the surface of the first dielectric layer 301 corresponding to the positions of the conductive vias 302; etching the first dielectric layer 301 using the mask layer as an etching mask until the surface of the substrate 300 is exposed to form through-holes; forming a conductive material layer on the surface of the first dielectric layer 301 and to fill the through-holes; and planarizing the conductive material layer until the surface of the first dielectric layer 301 is exposed. Thus, the conductive vias 302 may be formed in the through-holes.

Figure 5:
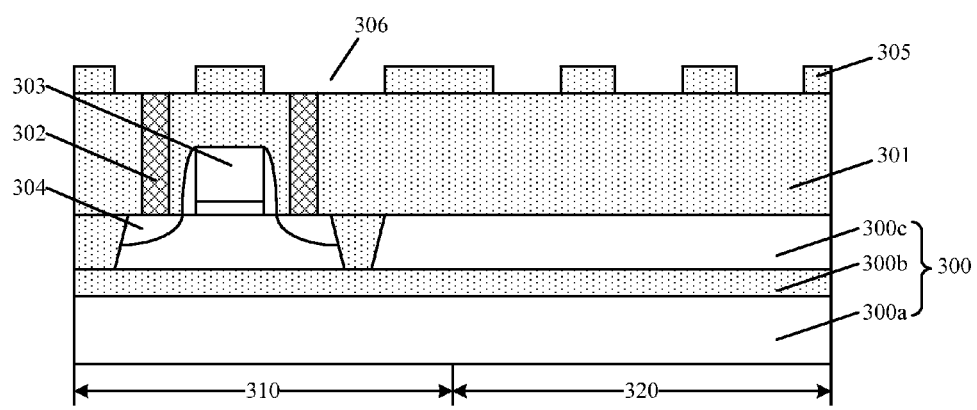

Returning to FIG. 15, after providing the substrate 300 with the structures, a second dielectric layer may be formed (S102). FIG. 5 illustrates a corresponding semiconductor structure.

As shown in FIG. 5, a second dielectric layer 305 is formed on the first dielectric layer 301. The second dielectric layer 305 may have a plurality of first openings 306. The first openings 306 in the first region 310 may expose the top surfaces of the conductive vias 302; and the openings 306 in the second region 320 may expose the surface of the first dielectric layer 301.

The second dielectric layer 305 having the plurality of first openings 306 may be used to subsequently form a first conductive layer. The portion of the first conductive layer in the first region 310 may be electrically connected with the source/drain regions 304 through the conductive vias 305 to apply a bias to the source/drain regions 304. Thus, it may need to expose the top surfaces of the conductive vias 302.

Further, the first conductive layer may also need to be formed in the first openings 306 in the second region 320. The second region 320 may be used to subsequently form an induction coil structure. Thus, the area of the second region 320 may be relatively large. During a process for subsequently forming a first conductive layer, a CMP process may be used to planarize a first conductive film to form the first conductive layer. If the portion of the first conductive layer is not formed in the second region 320, it may be easy to form defects on the surface of the second dielectric layer 305 by the CMP process. The metal material of the first conductive film may be left in the defects; and leakage issues and/or short circuit issues may occur in the semiconductor device. Therefore, the first openings 306 may also formed in the second dielectric layer 305 in the second region 320. The first conductive layer may also be subsequently formed in the first openings 306 in the second region 320. The portion of the first conductive layer in the second region 320 may be configured as dummy structures for overcoming the loading-effect during the subsequent CMP process. That is, the portion of the first conductive layer in the second region 320 may increase the number density of the first conductive layer in the second region 320. Thus, it may avoid forming defects and residual metal material on the surface of the second dielectric layer 305.

The second dielectric layer 305 may be made of any appropriate material, such as one or more of silicon oxide, silicon nitride, silicon oxynitride, low-K material, and ultra-low-K material, etc. A process for forming the second dielectric layer 305 having the plurality of first opening 306 may include forming a second dielectric film on the first dielectric layer 301 and the conductive vias 302; forming a patterned mask layer having patterns corresponding to the first openings 306 on the second dielectric film; and etching the second dielectric film using the patterned mask layer until the top surfaces of the conductive vias 302 are exposed. Thus, the second dielectric layer 305 having the plurality of first openings 306 may be formed.

Various processes may be used to form the second dielectric film, such as a chemical vapor deposition (CVD) process, a physical vapor deposition (PVD) process, an atomic layer deposition (ALD) process, or a flowable CVD (FCVD) process, etc. The second dielectric film may be etched by any appropriate process, such as an anisotropic dry etching process, etc.

The patterned mask layer may be a photoresist layer, or a hard mask layer, etc. The patterned mask layer made of photoresist may be formed by spin-coating a photoresist layer; and followed by a photolithography process. The hard mask layer may be made of one or more of SiN, TiN, TaN, and amorphous carbon, etc.

Figure 6:
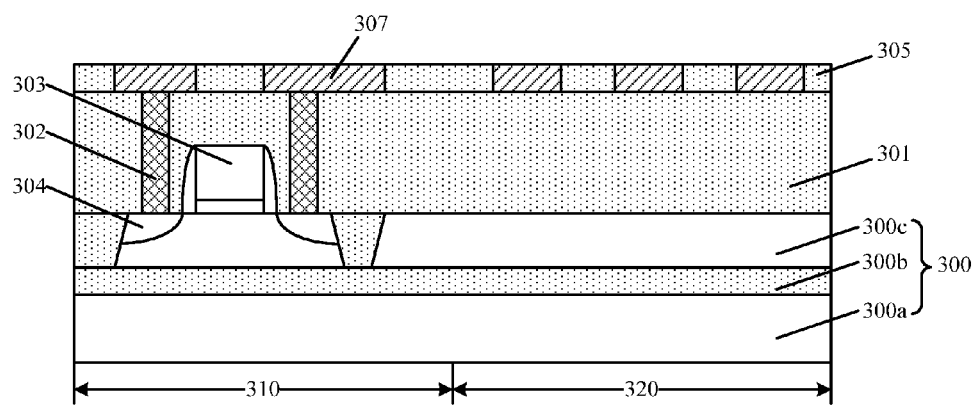

Returning to FIG. 15, after forming the second dielectric layer 305, a first conductive layer may be formed (S103). FIG. 6 illustrates a corresponding semiconductor structure.

As shown in FIG. 6, a first conductive layer 307 is formed in the first openings 306. The first conductive layer 307 may be made of any appropriate material, such as one or more of Cu, W, Al, Ag, Ti, TiN, Ta, and TaN, etc.

A process for forming the first conductive layer 307 may include forming a first conductive film on the second dielectric layer 305 and in the plurality of first openings 306; and followed by planarizing the first conductive film until the surface of the second dielectric layer 305 is exposed. Thus, the first conductive layer 307 may be formed.

The first conductive film may be formed by any appropriate process, such as an electroplating process, a chemical plating process, or a deposition process, etc. The planarization process may be a CMP process.

In one embodiment, the first conductive layer 307 is made of Cu. The first conductive film is formed by a copper electroplating (ECP) process.

The copper ECP process may include forming a conductive seed layer on the surface of the second dielectric layer 305 and the side and bottom surfaces of the first openings 306; and growing copper on the seed layer by an electroplating process until the openings 306 are filled. Thus, the first conductive film may be formed.

The first conductive layer 307 may be electrically connected with the conductive vias 302. Further, in order to increase the number density of the first dielectric layer 307, the first conductive layer 307 may also be formed in the second dielectric layer 305 in the second region 320. Thus, the defects and/or the residual metal on the surface of the second dielectric layer 305 may be avoided during the CMP process for forming the first conductive film.

An induction coil may be subsequently formed on the second dielectric layer 305 in the second region 320. The first conductive layer 307 in the second region 320 may be in between the induction coil and the substrate 300; and parasitic capacitances may be generated. The parasitic capacitances may reduce the quality factor of the induction coil structure. Thus, the first conductive layer 307 in the second region 320 may be subsequently removed.

Further, to improve the quality factor of the induction coil structure, passivation regions may be subsequently formed in the substrate 300 in the second region 320 to eliminate the substrate-power-consumption effect in the substrate 300 in the second region 320. Thus, it may need to subsequently etch the second dielectric layer 305 and the first dielectric layer 301 in the second region 320 to expose the surface of the substrate 300 to form the passivation regions.

In one embodiment, the patterns of the first conductive layer 307 in the second region 320 after removing the first conductive layer 307 may be used as an etching mask to subsequently etch the second dielectric layer 305 and the first dielectric layer 301. It may not need an extra photolithography process. Thus, the cost for forming an extra mask may be reduced; the fabrication process may be simplified; and the production cost may be reduced.

Figure 7:
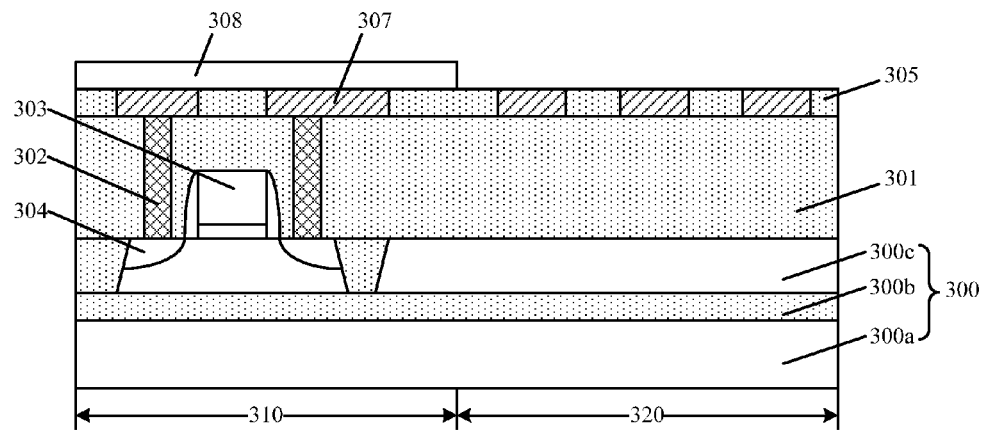

Returning to FIG. 15, after forming the first conductive layer 307, a mask layer may be formed (S104). FIG. 7 illustrates a corresponding semiconductor structure.

As shown in FIG. 7, a mask layer 308 is formed on a portion of the second dielectric layer 305 in the first region 310 and the portion of the first conductive layer 307 in the first region 310. The mask layer 308 may be used as a mask layer for subsequently forming second openings; and the second openings may be used for subsequently forming passivation regions.

The mask layer 308 may be made of any appropriate material. In one embodiment, the mask layer 308 is a photoresist layer. A process for forming the mask layer 308 made of photoresist may include spin-coating a photoresist film on the second dielectric layer 305 and the first conductive layer 307; and followed by exposing and developing the photoresist film to remove the portion of the photoresist film in the second region 320.

Optionally, a first stop layer (not shown) may be formed between the mask layer 308 and the second dielectric layer 305 and the first conductive layer 307. The first stop layer may be used as a polishing stop layer for subsequently forming a third dielectric layer to fill the subsequently formed second openings. The first stop layer may be made of any appropriate material, such as silicon nitride, etc.

A process for forming the first stop layer may include forming a first stop film on the second dielectric layer 305 and the first conductive layer 307; forming the photoresist layer (the mask layer 308) on the first stop film; and etching the first stop film until the second dielectric layer 305 is exposed. The first stop film may be formed by a CVD process, a PVD process, or an ALD process, etc. The first stop film may be etched by any appropriate process, such as an isotropic dry etching process, etc. The first stop film may also be used as a bottom antireflective coating for forming the mask layer 208.

Figure 8:
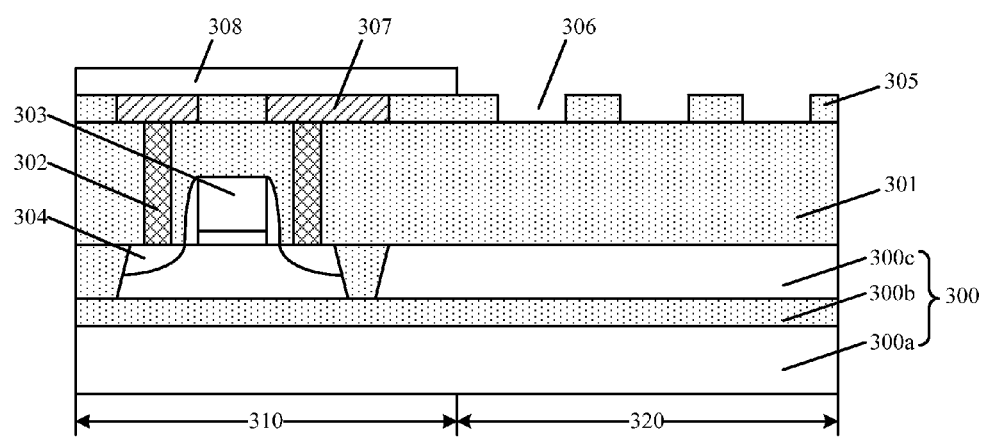

Returning to FIG. 15, after forming the mask layer 308, the portion of the first conductive layer 307 in the second region 320 may be removed (S105). FIG. 8 illustrates a corresponding semiconductor structure.

As shown in FIG. 8, the portion of the first conductive layer 307 in the second region 320 is removed; and the first openings 306 in the second region 320 may be exposed. That is, the portion of the first conductive layer 307 in the first openings 306 in the second region 320 is removed; and portions of the surface of the first dielectric layer 301 in the second region 320 may be exposed by the first openings 306.

The first conductive layer 307 in the second region 320 may generate parasitic capacitance with the subsequently formed induction coil. The parasitic capacitance may reduce the quality factor of the induction coil structure. Thus, before forming the induction coil structure, the first conductive layer 307 in the second region 320 may need to be removed. In one embodiment, the pattern of the first conductive layer 307 in the second region, i.e., the first openings 306 in the second region 320, and the mask layer 308 may together be used as an etching mask for subsequently forming second openings.

To keep the pattern of the first conductive layer 307, in one embodiment, after removing the first conductive layer 307, a sacrificial layer may be subsequently formed in the exposed first openings 306; and the sacrificial layer and the mask layer 308 may be together used as a mask layer for subsequently forming the second openings. By removing the first conductive layer 307 and forming the sacrificial layer, it may be able to prevent the metal material of the first conductive layer 207 from being left on the side surfaces of the subsequently formed second openings. Thus, it may be able to avoid the leakage current issue and/or short-circuit issue in the semiconductor device.

The first conductive layer 307 in the second region 320 may be removed by any appropriate process, such as a dry etching process, or a wet etching process, etc. In one embodiment, the first conductive layer 307 is made of Cu. Thus, a wet etching process may be used to remove the first conductive layer 307 in the second region 320. The etching solution of the wet etching process may include a $FeCl_3$ solution.

Figure 9:
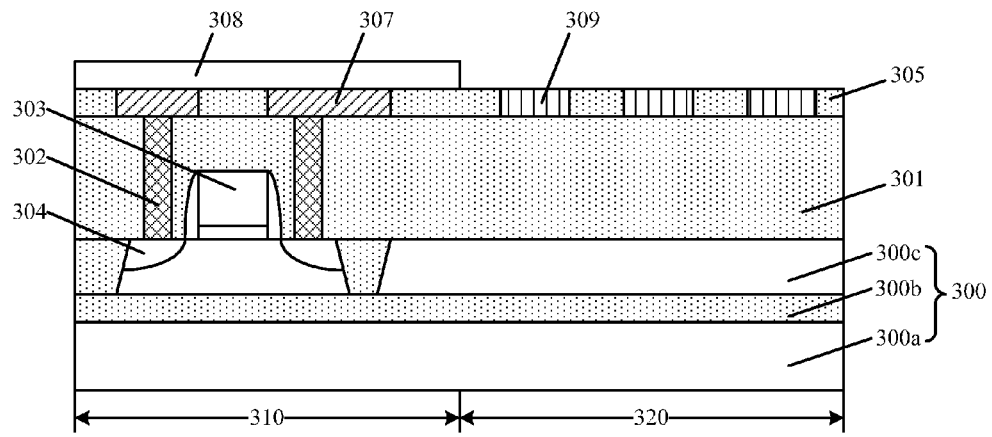

Returning to FIG. 15, after removing the first conductive layer 307 in the second region 320, a sacrificial layer may be formed (S106). FIG. 9 illustrates a corresponding semiconductor structure.

As shown in FIG. 9, a sacrificial layer 309 is formed in the first openings 306 in the second region 320. The sacrificial layer 309 and the mask layer 308 may be together used as an etching mask for subsequently forming second openings. The sacrificial layer 309 may be used to substitute the structure and position of the first conductive layer 307 in the second region 320.

A process for forming the sacrificial layer 309 may include forming a sacrificial film on the mask layer 308, the second dielectric layer 305 and in the first openings 306 in the second region 320; and followed by performing an etch-back process until the surface of the mask layer 308 and the surface of the second dielectric layer 305 are exposed. Thus, the sacrificial layer 309 may be formed.

The sacrificial layer 309 may be made of a material different from the first dielectric layer 301 and the second dielectric layer 305 such that the sacrificial layer 309 and the second dielectric layer 305 may have a relatively high etching selectivity ratio. In one embodiment, the sacrificial layer 309 may be a bottom anti-reflective coating (BARC) material. The BARC material may be organic material, or inorganic material. The inorganic material may an opaque material such as silicon nitride, etc. The sacrificial film made of inorganic BARC material may be formed by a CVD process, a PVD process, or an ALD process, etc. The organic material may be polymer, etc. The sacrificial film made of organic material may be formed by a spin-coating process, etc. In one embodiment, the sacrificial layer 309 is made of silicon nitride; and may be formed by a CVD process.

Figure 10:
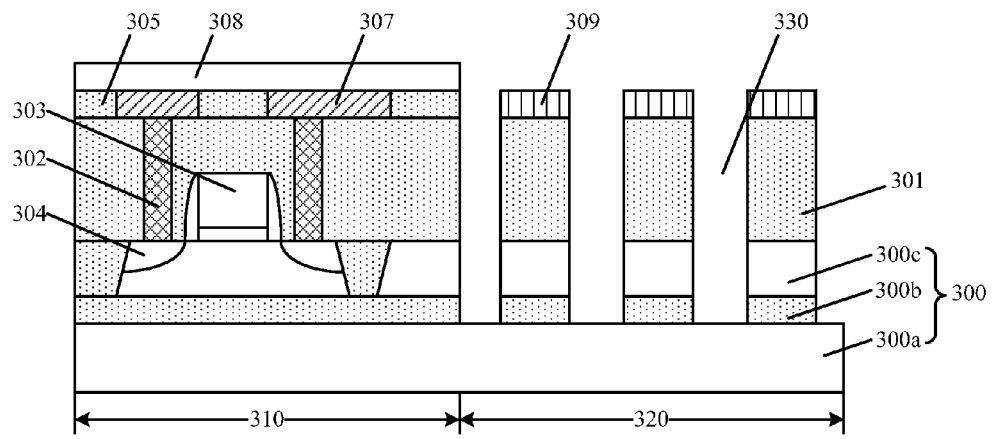

Returning to FIG. 15, after forming the sacrificial layer 309, a plurality of second openings may be formed (S107). FIG. 10 illustrates a corresponding semiconductor structure.

As shown in FIG. 10, a plurality of second openings 330 are formed. The plurality of second openings 330 may be formed by etching the first dielectric layer 301 and the second dielectric layer 305 using the sacrificial layer 309 and the mask layer 308 as an etching mask until the substrate 300 is exposed.

The second openings 309 may exposed portions of the surface of the substrate 300. The exposed portions of the substrate 300 may be subsequently passivated to form passivation regions. The passivation regions may be at the high-impedance state; and may be able to block the immigration of the charges induced by the inductor in the substrate 300. Thus, it may prevent the formation of an inducting current in the substrate 300; and may be able to avoid the quality factor reduction of the induction coil structure caused by the substrate-power-consumption effect.

In one embodiment, as shown in FIG. 10, the substrate 300 is a semiconductor on insulator substrate. Thus, the second openings 330 may penetrate through the semiconductor layer 300c and the insulation layer 300b; and portions of the base substrate 300a may be exposed. That is, it may need to etch through the second dielectric layer 305, the first dielectric layer 301, the second conductor layer 300c and the insulation layer 300b to expose the surface of the base substrate 300a to form the second openings 300a.

The etching process for forming the second openings 330 may be a dry etching process, a wet etching process, or an ion beam etching process, etc. In one embodiment, an anisotropic dry etching process is used to form the second openings 330. Because the etching direction of the anisotropic dry etching process may be controlled, it may be able to cause the sidewalls of the second openings 330 to be perpendicular to the surface of the base substrate 300a.

In one embodiment, in the etching process for forming the second openings 330, the sacrificial layer 309 and the mask layer 308 may be used as the etching mask. Because the sacrificial layer 309 may be made of insulation material, it may not form metal residues on the side and bottom surfaces of the second openings 330. It may ensure the stability of the semiconductor devices; and prevent the leakage current issue and the short-circuit issue.

In one embodiment, the second dielectric layer 305, the first dielectric layer 301 and the insulation layer 300b may be made of silicon oxide; and the semiconductor layer 300c may be made of single crystal silicon. Thus, the etching gas of the anisotropic dry etching process for forming the second openings 209 may include carbon fluoride gas, $O_2$, and a carrier gas, etc. The carbon fluoride gas may include one or more of $CF_4$, $C_3F_8$, $C_4F_8$, $CHF_3$, $CH_3F$, and $CH_2F_2$, etc. The carrier gas may include $N_2$, He, or Ar, etc. The flow rate of the carrier gas may be in a range of approximately 50 sccm/min~1000 sccm/min. The etching gas may also include one or more of $Cl_2$ and HBr.

In one embodiment, the etching gas may include both $Cl_2$ and HBr. The flow rate of HBr may be in a range of approximately 200 sccm~800 sccm. The flow rate of the $Cl_2$ may be in a range of approximately 20 sccm~100 sccm. The pressure of the chamber of the etching process may be in range of approximately 1 mTorr~200 mTorr. The bias voltage of the etching apparatus may be in a range of approximately 100 V~800 V. The power of the etching apparatus may be in a range of approximately 100 W~800 W.

The carbon fluoride gas may be able to etch the second dielectric layer 305, the first dielectric layer 301 and the insulation layer 300b; and form a polymer layer on the side surfaces of the second openings 330 simultaneously. $Cl_2$ or HBr may be used to etch the semiconductor layer 300c. At same time, the carbon fluoride may form a polymer layer on the etched side surfaces of the semiconductor layer. $O_2$ may be used to consume the polymer layer. During the etching process, by controlling the ratio of the carbon fluoride gas and $O_2$, it may be able to form and consume the polymer layer at the same time to control the morphology of the side surfaces of the second openings 330.

In certain other embodiments, if the substrate 300 is a single layer structure, the second openings 330 may expose the surface of the substrate 300. The etching process for forming the second openings 330 may only need to etch the second dielectric layer 305 and the first dielectric layer 301.

In certain other embodiments, after forming the mask layer 308, the first conductive layer 307 and the mask layer 308 may be together used as an etching mask to etch the second dielectric layer 305 and the first dielectric layer 301 until the substrate 300 is exposed. Thus, the second openings 330 may be formed. Because it may not need to form the sacrificial layer 309 to substitute the first conductive layer 307, the fabrication process may be simplified, the production cost may be reduced; and the production duration may be shortened.

Figure 11:
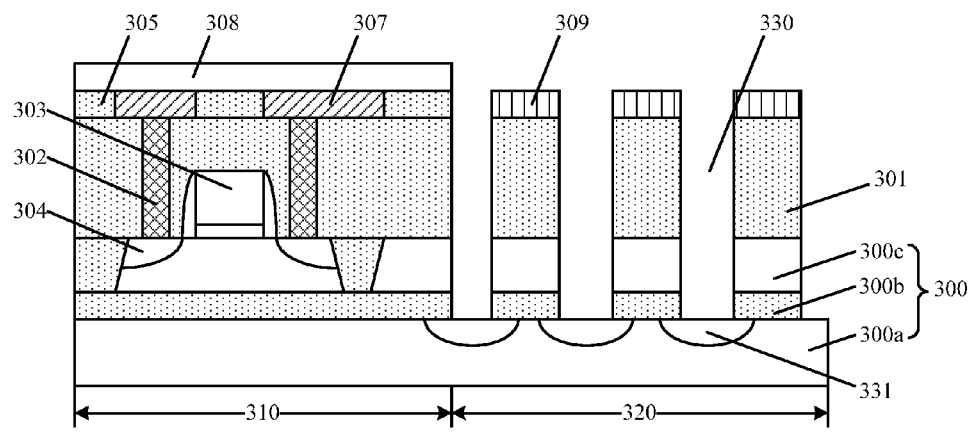

Returning to FIG. 15, after forming the second openings 330, passivation regions may be formed (S108). FIG. 11 illustrates a corresponding semiconductor structure.

As shown in FIG. 11, a passivation region 331 may be formed in the substrate 300 on the bottom of each of the second openings 330. The passivation regions 331 in the substrate 300 may be at the high-impedance state. When the subsequently formed induction coil structure induces charges in the substrate 300, the passivation regions 331 may be able to block the movement of the induced charges. Thus, it may prevent the generation of an inducting current in the substrate 300; and the substrate-power-consumption issue may be avoided.

In one embodiment, the substrate 300 is a semiconductor on insulator substrate, the passivation regions 331 may be formed in the base substrate 330a. The passivation regions 331 may be formed by any appropriate process. In one embodiment, an ion implantation process is used to form the passivation regions 331. The ions of the ion implantation process may include argon ions, or oxygen ions, etc. When the ions of the ion implantation process are argon ions, the passivation regions 331 may be turned into amorphous, or polycrystalline. When the ions of the ion implantation process are oxygen ions, the passivation regions 331 may be turned into oxide material. The energy of the ion implantation process may be in a range of approximately 100 KeV~500 KeV. The dose of the ions may be in a range of approximately $1E10/cm^2$~$1E16/cm^2$.

Figure 12:
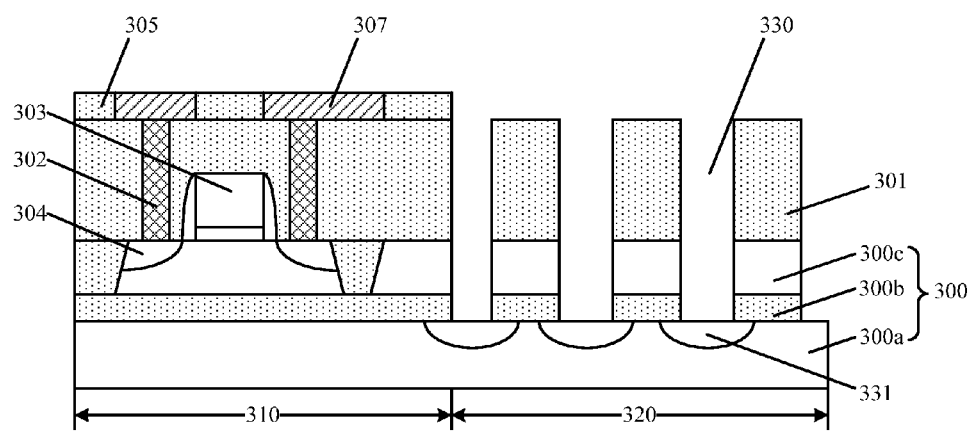

Returning to FIG. 15, after forming the passivation regions 331, the surface of the first insulation layer 301 in the second region 320 may be exposed (S109). FIG. 12 illustrates a corresponding semiconductor structure.

As shown in FIG. 12, the sacrificial layer 309 is removed, and the surface of the first insulation layer 301 in the second region 320 is exposed. A third insulation layer may be subsequently formed on the exposed surface of the first insulation layer 301 in the second region 320; and an induction coil structure may be subsequently formed on the third insulation layer. Because there is no first conductive layer 307 under the induction coil structure, the parasitic capacitance may be avoided. Thus, the quality factor of the inductor may be increased.

Various processes may be used to remove the sacrificial layer 309, such as a dry etching process, or a wet etching process, etc. In one embodiment, the sacrificial layer 309 is made of silicon nitride, a wet etching process may be used to remove the sacrificial layer 309; and the etching solution may be a phosphorus acid solution.

Further, as shown in FIG. 12, the mask layer 308 may be also removed. In one embodiment, the mask layer 308 may include a first stop layer and a photoresist layer on the first stop layer. Thus, the photoresist layer may be removed to expose the first stop layer. The first stop layer may be used as a polishing stop layer for subsequently forming the third dielectric layer. The photoresist layer may be removed by a wet etching process, or a plasma ashing process, etc.

In one embodiment, the first conductive layer 307 in the second region 320 may not be removed before forming the second openings 330, and the first conductive layer 307 in the second region 320 and the mask layer 308 may be together used as an etching mask for forming the second openings 330. Thus, after forming the passivation regions 331, the first conductive layer 307 in the second region 320 may be removed to expose the surface of the first dielectric layer 301. The first conductive layer 307 in the second region 320 may be removed by a dry etching process, or a wet etching process.

Returning to FIG. 15, after exposing the surface of the first dielectric layer 301 in the second region 320, a third dielectric layer may be formed (S110). FIG. 13 illustrates a corresponding semiconductor structure.

As shown in FIG. 13, a third dielectric layer 332 is formed in the second openings 330 and on the exposed surface of the first dielectric layer 301. The surface of the third dielectric layer 332 may level with the surface of the second dielectric layer 305 in the first region 310 and the first conductive layer 307 in the first region 310.

The third dielectric layer 332 may be used to fill the third openings 330. Further, an induction coil structure may be subsequently formed on the surface of the third dielectric layer 332.

The third dielectric layer 332 may be made of any appropriate material, such as silicon oxide, silicon nitride, silicon oxynitride, low-K material, or ultra-low-K material, etc. A process for forming the third dielectric layer 332 may include forming a third dielectric film on the surface of the second dielectric layer 305, the surface of the first conductive layer 307 and in the third openings 330; and followed by planarizing the third dielectric film until the surfaces of the second dielectric layer 305 and the first conductive layer 307 are exposed. Thus, the third dielectric layer 332 may be formed.

Various processes may be used to form the third dielectric film, such as a CVD process, a PVD process, or an ALD process, etc. Because the substrate 300 may be a semiconductor on insulator substrate, the second openings 330 may penetrate through the semiconductor layer 300c and the insulation layer 300b. Thus, the height-to-width ratio of the second openings 330 may be relatively large. Therefore, in one embodiment, a high aspect ratio process (HARP) is used to form the third dielectric film.

The HARP may be able to cause the third dielectric film in the second openings 330 to be significantly dense; and it may avoid to form cracks or defects in the third dielectric film in the second openings 330. The deposition gas of the HARP may include $Si(OC_2H_5)_4$ and $O_3$, etc. The flow rate of $Si(OC_2H_5)_4$ may be in a range of approximately 500 mg/min~8000 mg/min. The flow rate of $O_3$ may be in a range of approximately 500 sccm~3000 sccm. The pressure of the HARP may be in a range of approximately 300 Torr~600 Torr. The temperature of the HARP may be in a range of approximately 400° C.~600° C. Further, the deposition gas may also include $N_2$, $O_2$, and He, etc. The flow rate of $N_2$ may be in a range of approximately 1000 sccm~10000 sccm. The flow rate of $O_2$ may be in a range of approximately 0~5000 sccm. The flow rate of He may be in a range of approximately 5000 sccm~20000 sccm.

In one embodiment, the third dielectric film may be planarized by a CMP process. Further, the first stop layer may be formed on the surface of the second dielectric layer 305 in the first region 310 and the surface of the first conductive layer 307 in the first region 310. The first stop layer may be used as a polishing stop layer for the CMP process. After exposing the first stop layer by the CMP process, the CMP process may be further performed for a certain time to expose the surface of the second dielectric layer 305 in the first region 310 and the surface of the first conductive layer 307 in the first region 310.

Returning to FIG. 15, after forming the third dielectric layer 332, a second conductive layer may be formed (S111). FIG. 14 illustrates a corresponding semiconductor structure.

As shown in FIG. 14, a second conductive layer 333 may be formed on the third dielectric layer 332 in the second region 320 and the first conductive layer 307 in the first region 310. The portion of the second conductive layer 333 in the second region 320 may form an induction coil structure. Further, a fourth dielectric layer 334 may also be formed on the third dielectric layer 332 in the second region 320, portions of the first conductive layer 307 in the first region 310, and the surface of the second dielectric layer 305 in the first region 310.

A process for forming the second conductive layer 333 may include forming the fourth dielectric layer 334 having a plurality of third openings (not labeled) on the third dielectric layer 332 in the second region 320, portions of the first conductive layer 307 in the first region 310, and the surface of the second dielectric layer 305 in the first region 310. The plurality of third openings may expose portions of the third dielectric layer 332 and portions of the first conductive layer 307 in the first region 310. Further, the process may also include forming the third conductive layer 333 in the third openings.

The fourth dielectric layer 334 may be made of any appropriate material, such as silicon oxide, silicon nitride, silicon oxynitride, low-K material, or ultra-low-K material, etc. A process for forming the fourth dielectric layer 334 may include forming a fourth dielectric film on the second dielectric layer 305, the first conductive layer 307 and the third dielectric layer 332; forming a patterned mask layer having patterns exposing the regions and positions corresponding to the second conductive layer 333; and etching the fourth dielectric film using the patterned mask layer as an etching mask until the surface of the third dielectric layer 332 is exposed. Thus, the fourth dielectric layer 334 may be formed. The fourth dielectric film may be formed by any appropriate process, such as a CVD process, a PVD process, or an ALD process, etc.

In one embodiment, the bottom of the fourth dielectric layer 334 may have a second stop layer (not shown). The second stop layer may be used as an etching stop layer for forming the fourth dielectric layer 334. The fourth dielectric film may be etched until the second stop layer is exposed; and then the second stop layer may be etched until the third dielectric layer 332 is exposed.

The second stop layer may be made of a material different from that of the fourth dielectric layer 334. In one embodiment, the second stop layer is made of silicon nitride; and the fourth dielectric layer 334 is made of silicon oxide.

Further, referring to FIG. 14, a portion of the second conductive layer 333 may be formed in the first region 310. Specifically, the portion of the second conductive layer 333 may be formed on the surface of the first conductive layer 307 in the first region 310; and may be used to electrically connect with the first conductive layer 307 in the first region 310. Thus, the second conductive layer 333 in the first region 310 may be used as the interconnect lines of an IC.

A process for forming the second conductive layer 333 may include forming a second conductive film on the fourth dielectric layer 334 and in the third openings; and planarizing the second conductive film until the surface of the fourth dielectric layer 334 is exposed. Thus, the second conductive film 333 may be formed.

The second conductive film may be made of any appropriate material, such as one or more of Cu, W, Al, Ag, Ti, Ta, TiN, and TaN, etc. Various processes may be used to form the second conductive film, such as an electroplating process, a chemical plating process, or a deposition process, etc. The planarization process may be a CMP process, etc.

The portion of the second conductive layer 333 in the second region 320 may form an induction coil structure. Because there may be only the third dielectric layer 332 and the first dielectric layer 301 between the second conductive layer 333 and the substrate 300 in the second region 320, a parasitic capacitance may be not be formed between the induction coil structure and the substrate 300. Thus, the quality factor Q of the inductor may be increased. Further, because the passivation regions 331 may be formed in the substrate 330; and may be able to prevent the substrate-power-consumption effect, the quality factor Q of the inductor may be further increased.

Thus, a semiconductor device may be formed by the above disclosed processes and methods; and the corresponding semiconductor device is illustrated in FIG. 14. As shown in FIG. 14, the semiconductor device includes a substrate 300 having a first region 310 and a second region 320. The semiconductor device may also include a gate structure 303 formed on the surface of the substrate 300 in the first region 310, and a plurality of the passivation regions 331 formed in the surface of the substrate 330 in the second region 320. Further, the semiconductor device may also include source/drain regions 304 formed in the surface of the substrate 300 at both sides of the gate structure 303; and conductive vias 302 formed on the source/drain regions 304.

Further, the semiconductor device may also include a first dielectric layer 301 formed over substrate 300 with the conductive vias 302 penetrating through the first dielectric layer 301. Further, the semiconductor device may also include a second dielectric layer 305 formed on the first dielectric layer 301 in the first region 310; and a third dielectric layer 332 formed on the surface of the first dielectric layer 301 in the second region 320 with portions of the third dielectric layer 301 penetrating through the first dielectric layer 301 in the second region 320 and connecting with the passivation regions 331.

Further, the semiconductor device may also include a first conductive layer 307 formed on the first dielectric layer 301 and in the second dielectric layer 305 in the first region 310; a fourth dielectric layer 334 formed on the second dielectric layer 305 and the third dielectric layer 332. Further, the semiconductor device may also include a second conductive layer 333 formed on the second dielectric layer 305, the third dielectric layer 332 and portions of the first conductive layer 307 with portions of the second conductive layer 333 in the second region 320 being configured as an induction coil structure and portions of the second conductive layer 333 being electrically connected with the first conductive layer 307 in the first region 310. The detailed structures and intermediate structures are described above with respect to the fabrication processes.

According to the disclosed methods and structures, a first region of a substrate may be used for forming semiconductor devices, and a second region of the substrate may be used for forming an inductor. A first dielectric layer maybe formed over the substrate; and a second dielectric layer may be formed over the first dielectric layer. After forming a first conductive layer in first openings in the second dielectric layer, because the bottoms of the first openings in first region may expose the tops of the conductive vias electrically connecting with source/drain regions of the semiconductor devices, the first conductive layer in the first region may be on the tops of the conductive vias; and may be used to electrically connect with the semiconductor device in the first region.

The first conductive layer in the second region may be used as a dummy layer to increase the number density of the first conductive layer in the second region. The dummy layer may cause the second dielectric layer to be flat, and have no defects after a CMP process for forming the first conductive layer. Further, the patterns of the first conductive layer in the second region may be used as an etching mask to etch the first dielectric layer and the second dielectric layer in the second region to form second openings to expose the surface of the substrate in the second region. Passivation regions may be formed in the surface of the substrate on the bottoms of the second openings. The passivation regions may be used to reduce the substrate-power-consumption effect; and the quality factor of the induction coil structure.

Further, during the process for forming the passivation regions, no extra mask may need; and no extra photolithography processes may need. Thus, the production cost may be reduced; and the fabrication process may be simplified.

Further, after forming the passivation regions, the first dielectric layer in the first region may be exposed. That is, the first conductive layer on first dielectric layer in the second region may be removed. After subsequently forming an induction coil structure on a third dielectric layer in the second region, there may be only the third dielectric layer and the first dielectric layer between the induction coil structure and the substrate. It may prevent the formation of a parasitic capacitance between the induction coil structure and the substrate. Thus, the quality factor of the induction coil structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
   providing a substrate having a first region and a second region;
   forming a first dielectric layer on a surface of the substrate;
   forming a second dielectric layer having a plurality of first openings exposing portion of a top surface of the first dielectric layer;
   forming a first conductive layer in the first openings;
   etching the second dielectric layer in the second region and the first dielectric layer in the second region until the surface of the substrate is exposed to form a plurality of second openings;
   forming passivation regions in portions of the substrate exposed by the second openings;
   exposing the surface of the first dielectric layer in the second region;
   forming a third dielectric layer on the surface of the first dielectric layer and in the second openings; and
   forming a second conductive layer, a portion of which is configured as an inductor, over the third dielectric layer in the second region.

2. The method according to claim 1, the substrate further comprises:
   a base substrate;
   an insulation layer on the base substrate; and
   a semiconductor layer on the insulation layer.

3. The method according to claim 2, wherein:
   the second openings expose portions of a surface of the base substrate; and
   the passivation regions are formed in portions of the base substrate exposed by the second openings.

4. The method according to claim 3, wherein etching the second dielectric and the first dielectric layer further comprises:
   etching the second dielectric layer, the first dielectric layer, the semiconductor layer, and the insulation layer to form the second openings.

5. The method according to claim 1, further comprising:
   forming conductive vias in the first dielectric layer in the first region,
   wherein the first openings in the first region expose top surfaces of the conductive vias.

6. The method according to claim 1, before forming the second openings, further comprising:
   forming a mask layer on the second dielectric layer in the first region and the first conductive layer in the first region.

7. The method according to claim 6, wherein:
   the mask layer and the first conductive layer in the second region are used as an etching mask to etch the second dielectric layer and the first dielectric layer to form the second openings.

8. The method according to claim 7, wherein exposing the first dielectric layer in the first region further comprises:
   removing the first conductive layer in the second region to expose the first dielectric layer in the first region.

9. The method according to claim 6, further comprising:
   removing the first conductive layer in the second region using the mask layer as a mask to expose the first openings in the second region;
   forming a sacrificial layer in the first openings in the second region; and
   etching the second dielectric layer in the second region and the first dielectric layer in the second region using the mask layer and the sacrificial layer as an etching mask until the surface of the substrate is exposed.

10. The method according to claim 9, after forming the passivation regions, further comprising:
    removing the sacrificial layer to expose the surface of the first dielectric layer in the first region.

11. The method according to claim 9, wherein:
    the sacrificial layer is made of a bottom anti-reflective material.

12. The method according to claim 1, wherein forming the first conductive layer further comprises:
    forming a first conductive film on the surface of the second dielectric layer and in the first openings; and
    planarizing the first conductive film until the surface of the second dielectric layer is exposed.

13. The method according to claim 12, wherein:
    the first conductive film is formed by one of an electroplating process, a chemical plating process and a deposition process; and
    the first conductive film is planarized by a chemical mechanical polishing process.

14. The method according to claim 1, wherein forming the second conductive layer further comprises:
forming a fourth dielectric layer having a plurality of third openings on the second dielectric layer in the first region, the first conductive layer in the first region and the third dielectric layer; and
forming the second conductive layer in the third openings.

15. The method according to claim 14, wherein:
the third openings expose the third dielectric layer in the second region and portions of the surface of the first conductive layer in the first region;
a portion of the second conductive layer is on the first conductive layer in the first region; and
a portion of the second conductive layer in second region is configured as the induction coil structure.

16. A semiconductor device, comprising:
a substrate having a first region and a second region;
a plurality of passivation regions blocking inducting current formed in portions of a surface of the substrate in the second region
a first dielectric layer formed over the surface of the substrate;
a second dielectric layer formed on a top surface of the first dielectric layer in the first region;
a first conductive layer formed in the second dielectric layer and on the first dielectric layer in the first region;
a third dielectric layer formed on the surface of the first dielectric layer with portions penetrating through the first dielectric layer in the second region and connecting with plurality of passivation regions; and
a second conductive layer, a portion of which is configured as an inductor in the second region and a portion of which is electrically connected with the first conductive layer in the first region.

17. The semiconductor device according to claim 16, wherein the substrate further comprises:
a base substrate;
an insulation layer on the base substrate; and
a semiconductor layer on the insulation layer.

18. The semiconductor device according to claim 16, wherein:
the first conductive layer is made of Cu.

19. The semiconductor device according to claim 16, wherein:
the second conductive layer is made of Cu.

* * * * *